United States Patent
Feistkorn et al.

(10) Patent No.: US 7,077,687 B1
(45) Date of Patent: Jul. 18, 2006

(54) CONNECTING DEVICE TO BE SOLDERED TO CIRCUIT BOARDS FOR CONNECTION OF ELECTRICAL CONDUCTORS, A METHOD FOR PRODUCTION OF THE CONNECTING DEVICE AND A DEVICE FOR CONNECTING CONDUCTORS TO THE CONNECTING DEVICE

(76) Inventors: Vera Feistkorn, Hohenhausling 11, 96187 Stadelhofen (DE); Klaus Wolf, Hohenhausling 11, 96187 Stadelhofen (DE)

( * ) Notice: Subject to any disclaimer, the term of this patent is extended or adjusted under 35 U.S.C. 154(b) by 308 days.

(21) Appl. No.: 10/129,268

(22) PCT Filed: Nov. 3, 2000

(86) PCT No.: PCT/EP00/10834

§ 371 (c)(1),
(2), (4) Date: Sep. 12, 2002

(87) PCT Pub. No.: WO01/33673

PCT Pub. Date: May 10, 2001

(30) Foreign Application Priority Data

Nov. 4, 1999 (DE) .......................................... 199 53 362
Apr. 3, 2000 (DE) .......................................... 100 16 565

(51) Int. Cl.
*H01R 4/24* (2006.01)

(52) U.S. Cl. ...................... 439/406; 439/399

(58) Field of Classification Search ................. 439/406, 439/407, 399
See application file for complete search history.

(56) References Cited

U.S. PATENT DOCUMENTS

| | | | | | |
|---|---|---|---|---|---|
| 2,651,768 | A | * | 9/1953 | Oortgijsen | ................... 439/392 |
| 3,993,391 | A | * | 11/1976 | Vernerey et al. | ............ 439/407 |
| 4,806,120 | A | * | 2/1989 | Baker | .......................... 439/399 |
| 4,973,261 | A | * | 11/1990 | Hatagishi et al. | ........... 439/397 |
| 6,012,942 | A | * | 1/2000 | Volstorf | ....................... 439/397 |
| 6,165,003 | A | * | 12/2000 | Bigotto | ....................... 493/406 |

* cited by examiner

*Primary Examiner*—Gary Paumen
(74) *Attorney, Agent, or Firm*—Rothwell, Figg, Ernst & Manbeck

(57) ABSTRACT

The invention relates to a connector for soldering to boards for terminating an electrical conductor, consisting of a cuboid of conductive material, comprising in its surface at least one recess and a longitudinal groove into which the conductor can be urged to make the contact by the cutting edges of the longitudinal groove thereby biting into the insulation of the conductor.

Figure 1:
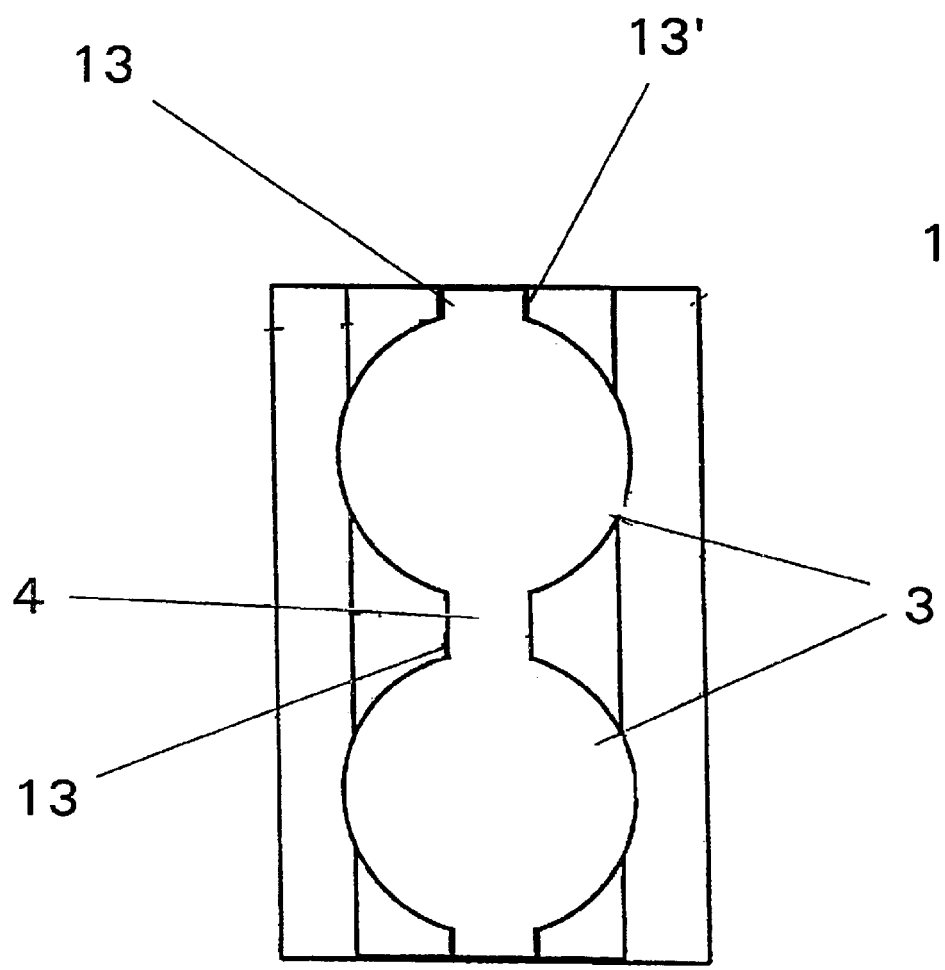

The invention relates also to methods of fabricating the connector in accordance with the invention in small and large volume as well as to a device for terminating the conductor to a connector.

19 Claims, 3 Drawing Sheets

CONNECTING DEVICE TO BE SOLDERED TO CIRCUIT BOARDS FOR CONNECTION OF ELECTRICAL CONDUCTORS, A METHOD FOR PRODUCTION OF THE CONNECTING DEVICE AND A DEVICE FOR CONNECTING CONDUCTORS TO THE CONNECTING DEVICE

The invention relates to a connector for soldering to boards for terminating an electrical conductor as set forth in the preamble of claim 1. It also relates to a method of fabricating the connector as well as to a device for terminating a conductor to the connector.

In electrical and electronic devices there is often the necessity of connecting single leads or ribbon conductors to the tracks of a circuit board. The connector used for this purpose is required to be simple and easy to assemble whilst reliably ensuring a good contact—even when exposed to mechanical stress—for the lifetime of the device.

The objective of the invention is to provide a connector which in addition to the aforementioned advantages can be soldered highly space-saving to rigid and flexible tracks, is simple to fabricate, requires no stripping of the conductor insulation and is suitable for automated board assembly and contacting.

This objective is achieved by the features as set forth in claim 1. The cuboidal shape permits automated board assembly, e.g. in SMD technology, resulting in a slimline connector which can thus be arranged closely spaced on the circuit board. The conductor is urged insulated into the groove and can be released and reterminated at any time. The edges of the groove bite through the insulation of the conductor, producing the contact.

Advantageous embodiments of the connector in accordance with the invention read from the sub-claims 2 to 5. Thus, by multiplying the cutting edges of the groove as set forth in claim 2 good contact and mechanical strength are improved. The guide trough for the conductor as set forth in claim 3 is conducive to assembly. By the aspect as set forth in claim 4 individual connectors can be arrayed even closer together since in the region of the recesses the insulation of the conductor is retained. The aspect as set forth in claim 5 improves the mechanical strength both statically, e.g. when subjected to an inclined traction, and dynamically, when exposed to vibration.

One substantial feature of the connector as set forth in claims 1 to 5 is, however, its especially simple shape, it being this shape that first makes it possible to apply highly advantageous methods of fabrication in mass production.

The methods as set forth in claims 6 and 7 permit fast and cost-effective small to medium volume production whilst the methods as set forth in claims 8 to 10 are geared for simple high volume production. Automated contacting is possible to advantage with a device as set forth in claims 11 and 12.

Figure 2:
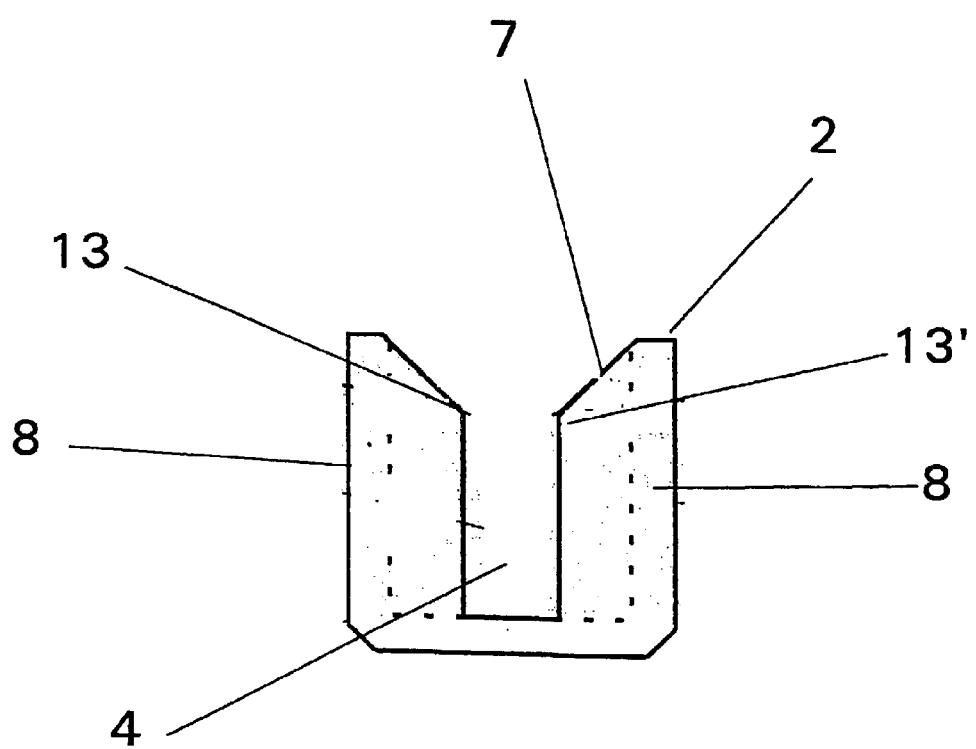
Figure 3:
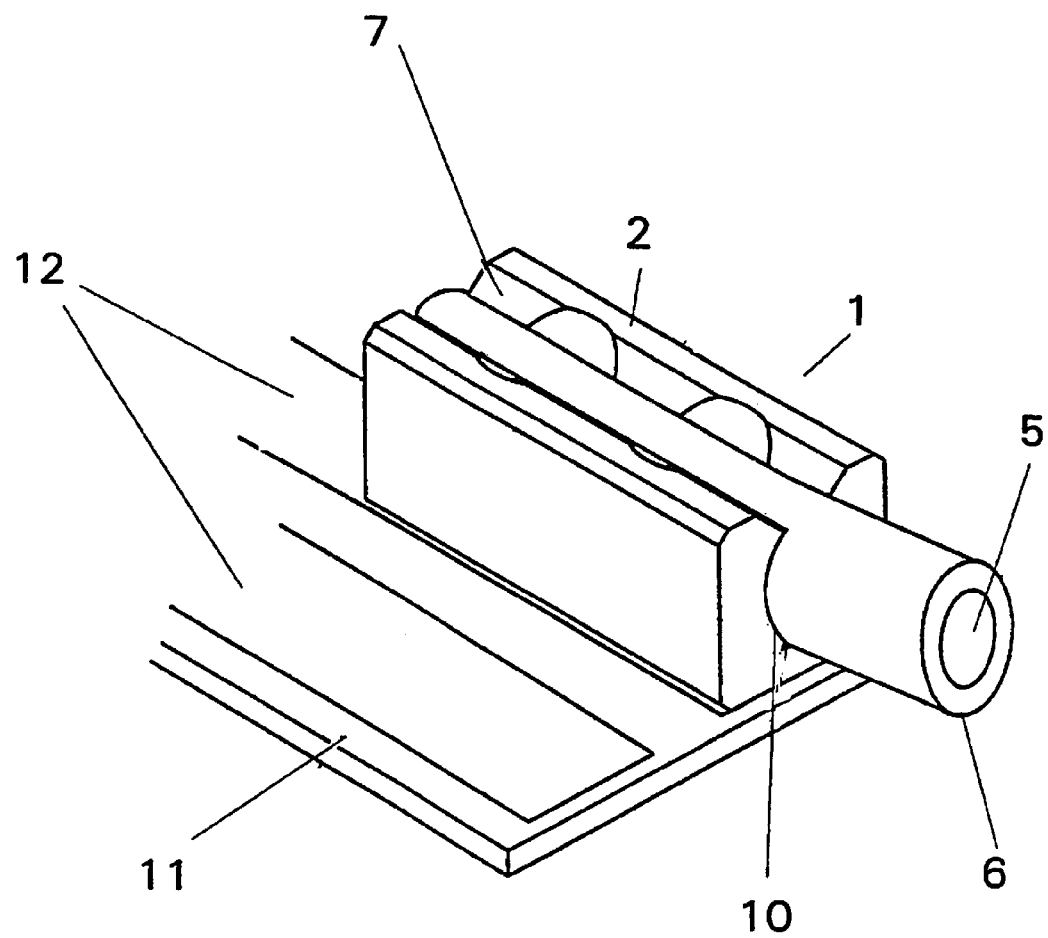

The invention will now be detained by way of a preferred embodiment with reference to the drawings in which:

FIG. 1 is a view from above of the connector
FIG. 2 is a front view of the connector
FIG. 3 is an isometric view of the connector FIGS. 1 to 3 show the connector in accordance with the invention greatly magnified. Referring now to FIG. 1 there is illustrated how the connector in a view from above is substantial formed by a cuboidal element 1 in which a longitudinal groove 4 is configured preferably in the middle. As also evident from FIG. 1 two recesses 3 are configured in the cuboid 1 above the longitudinal groove 4 which in the shape as shown are provided regular cylindrical. However, the recesses 3 could have any cross-section suitable for receiving a driver urging a conductor into place.

Referring now to FIG. 2 there is illustrated how the cuboid 1 is formed by sidewalls 8 flanking the longitudinal groove 4. The longitudinal groove 4 must not necessarily be a parallel groove, instead its width may vary in depth. In the preferred example embodiment, as mentioned, at or in the surface 2 two recesses 3 are provided, in such a way that only three portions remain of the longitudinal groove 4. These three portions may feature differing groove widths. These three portions form the edges needed to bite into or partly strip the insulation of the conductor 5.

Provided furthermore at the surface 2 in the direction of the longitudinal groove 4 is a guide trough 7. This guide trough 7 is configured by simply bevelling the upper groove edges.

The cuboid 1 is made of a conductive material, preferably a conductive sintered material, to thus permit being directly soldered in place on a track 12 of a board 11 automated or manually. A conductor 5 is terminated by it being located in the guide trough 7 and urged into the longitudinal groove 4 by a driver comprising two pins adapted to the recesses 3, the insulation 6 of the conductor 5 being nicked and urged apart in the three remaining portions, the groove cutting edges 13, of the longitudinal groove 4 producing the contact there. This condition is evident more particularly in FIG. 3, this also showing how the portion of the longitudinal groove 4 at which the conductor 5 emerges includes a rounded opening 10, the advantages of which have already been explained above.

As aforementioned, the shape of the recesses 3 shown right cylindrical in FIGS. 1 to 3 is not a necessity. In production by rolling or embossing a conical shape of other cross-section, as necessary, may prove suitable. Since the conductor 5 after contacting in the region of the recesses 3 is still fully insulated, the cuboid 1 may be made so slim for a space-saving arrangement that the recesses 3 penetrate the sidewalls.

The invention is not restricted to the connector as described. Likewise conceivable is e.g. a cuboid 1 comprising two or more longitudinal grooves in parallel. It is also conceivable to provide more than two recesses 3. To terminate the conductor(s) 5 at the connector, the latter together with the board 11 comprising the track 12 is mounted in a device as set forth in claims 11 and 12. This device comprises a mount for the board and a counterpart—a driver—arranged movable thereto. The mount comprises a window having the cross-section of the cuboid 1. Provided on the driver are pins which on advance of the driver protrude into the recess and thus urge an inserted conductor 5 into the longitudinal groove 4 of the connector. Advantageously, the mount is configured as a trough in which the cuboids 1 can be fed crosswise or lengthwise to the driver.

What is claimed is:

1. A non-sheet metal electrical connector for soldering to boards for terminating an electrical conductor and not having a rear insulation crimping part or a forward mating part, comprising a cuboid of conductive material, characterized in that the cuboid (1) comprises at a surface (2) thereof at least one recess (3) and a longitudinal groove (4) into which the conductor (5) can be urged to make the contact by cutting edges (13, 13') of the longitudinal groove (4) thereby biting into the insulation (6) of the conductor (5).

2. The connector as set forth in claim 1, characterized in that the cuboid (1) comprises on its surface (2) two or more recesses (3) in a row.

3. The connector as set forth in claim 1, characterized in that a guide trough (7) for the conductor (5) oriented in the direction of the longitudinal groove (4) is provided on the surface (2) of the cuboid (1).

4. The connector as set forth in claim 1, characterized in that the recess (3) penetrates the sidewalls (8) of the cuboid (1) laterally.

5. The connector as set forth in claim 1, characterized in that a portion of the longitudinal groove (4) at which the conductor (5) emerges, comprises a rounded opening (10).

6. A non-sheet metal electrical connector for terminating an electrical conductor (5) coaxially surrounded by an electrically insulating material (6), the electrical connector comprising an electrically conductive body (1) not having a rear insulation crimping part or a forward mating part, wherein the body (1) comprises:
   a longitudinal groove (4) for receiving the electrical conductor (5), the longitudinal groove including a first cutting edge (13) and a second cutting edge (13') facing the first cutting edge (13), wherein the cutting edges are configured to cut into the electrically insulating material (6) when the conductor (5) is urged into the longitudinal groove; and
   a recess (3) configured above said longitudinal groove.

7. The conductor as set forth in claim 6, wherein the body (1) further comprises a second recess (3) configured above said longitudinal groove, and wherein the cutting edges are positioned between the first recess and the second recess.

8. The connector as set forth in claim 6, wherein the body further comprises a guide trough (7), the guide trough (7) being configured above said longitudinal groove and being configured to guide the conductor into the longitudinal groove.

9. The connector as set forth in claim 6, wherein the recess (3) penetrates sidewalls (8) of the body (1) laterally.

10. The connector as set forth in claim 6, characterized in that a portion of the longitudinal groove comprises a rounded opening (10).

11. A non-sheet metal electrical connector for terminating an electrical conductor (5) coaxially surrounded by an electrically insulating material (6), the electrical connector comprising an electrically conductive body (1) not having a rear insulation crimping part or a forward mating part, wherein the body (1) comprises:
   a longitudinal groove (4) for receiving the electrical conductor (5), the longitudinal groove including a first cutting means (13) and a second cutting means (13') facing the first cutting means, wherein the cutting means are for cutting into the electrically insulating material (6) when the conductor (5) is urged into the longitudinal groove; and
   a recess (3) configured above said longitudinal groove.

12. The conductor as set forth in claim 11, wherein the body (1) further comprises a second recess (3) configured above said longitudinal groove, and wherein the cutting means are positioned between the first recess and the second recess.

13. The connector as set forth in claim 11, wherein the body further comprises guide means (7), the guide means (7) being configured above said longitudinal groove and being configured to guide the conductor into the longitudinal groove.

14. The connector as set forth in claim 11, wherein the recess (3) penetrates a first sidewall (8) and a second sidewall (8) of the body (1) laterally.

15. The connector as set forth in claim 11, characterized in that a portion of the longitudinal groove comprises a rounded opening (10).

16. A connector apparatus, comprising:
   a base;
   a first side wall (8) extending upwardly from the base and having a face and a top side;
   a second side wall (8) extending upwardly from the base and having face and a top side, the face of the second side wall facing the face of the first side wall;
   a channel formed by the base, the first side wall, and the second side wall;
   a first recess formed in the face of the first side wall and extending downwardly from the top side of the first side wall;
   a second recess formed in the face of the second side wall and extending downwardly from the top side of the second side wall, wherein the second recess is substantially directly across from the first recess;
   a first cutting edge positioned adjacent the first recess;
   a second cutting edge positioned adjacent the second recess; and
   an electrical conductor surrounded by an insulator, wherein
      at least a portion of the electrical conductor is positioned in said channel, and
      both said first and second cutting edges penetrate the insulator and make electrical contact with the electrical conductor.

17. The connector apparatus of claim 16, further comprising:
   a third recess formed in the face of the first side wall and extending downwardly from the top side of the first side wall; and
   a fourth recess formed in the face of the second side wall and extending downwardly from the top side of the second side wall, wherein
      the fourth recess is substantially directly across from the third recess,
      the first cutting edge is positioned between the first and third recess, and
      the second cutting edge is positioned between the second and fourth recess.

18. The connector apparatus of claim 16, further comprising guide means for guiding the electrical conductor into said channel.

19. The connector apparatus of claim 16, wherein the base, the first side wall, and the second side wall are from an electrically conducting material.

* * * * *